United States Patent [19]
Watanabe

[11] Patent Number: 5,703,641
[45] Date of Patent: Dec. 30, 1997

[54] SOLID-STATE COLOR IMAGE PICKUP DEVICE FOR REPRODUCING A COLOR IMAGE

[75] Inventor: Tohru Watanabe, Ogaki, Japan

[73] Assignee: Sanyo Electric Co., Ltd., Osaka, Japan

[21] Appl. No.: 414,756

[22] Filed: Mar. 31, 1995

[30] Foreign Application Priority Data

Mar. 31, 1994 [JP] Japan ............... 6-063383
Nov. 14, 1994 [JP] Japan ............... 6-279229

[51] Int. Cl.$^6$ .................................................. H04N 9/07
[52] U.S. Cl. ............... 348/274; 348/272; 348/273; 348/277
[58] Field of Search .................... 348/272–274, 348/277–283; 437/2, 3, 45; H04N 9/077

[56] References Cited

U.S. PATENT DOCUMENTS

| 4,434,435 | 2/1984 | Fujimoto ............... 348/277 |
| 4,500,913 | 2/1985 | Hashimoto et al. ............... 348/273 |
| 4,922,334 | 5/1990 | Hashimoto et al. ............... 348/274 |
| 5,028,547 | 7/1991 | Iizuka et al. ............... 437/2 |
| 5,146,320 | 9/1992 | Ishikawa et al. ............... 348/274 |

*Primary Examiner*—Glenton B. Burgess
*Attorney, Agent, or Firm*—Loeb & Loeb LLP

[57] ABSTRACT

A solid-state color image pickup device which is capable of simplifying signal processing with respect to picture signals. A color filter mounted on the solid-state image pickup device is composed of first to fourth filter elements E1 to E4. The sum E1+E2 of the signals of color components obtained by adding the color components of the first filter element E1 and the second filter element E2 which are disposed in an odd-numbered row is equal to the sum E3+E4 of the signal of color components obtained by adding the color components of the third filter element E3 and the fourth filter element E4 which are disposed in an even-numbered row. A brightness signal having color components in a predetermined ratio is obtained for each of E1+E2, and E3+E4. A color component signal representing one of the three primary colors (R, G, B) of light is represented by the difference between the color component signals of the first filter element E1 and the second filter element E2, and the difference between the color component signals of the third filter element E3 and the fourth filter element E4. Thus, signals necessary for producing a color image are obtained for each row of light-receiving picture elements.

20 Claims, 5 Drawing Sheets

SOLID-STATE COLOR IMAGE PICKUP DEVICE FOR REPRODUCING A COLOR IMAGE

BACKGROUND OF THE INVENTION

1. Field of the Invention

The present invention relates to a solid-state color image pickup device on which a mosaic color filter is mounted and, more particularly, to the structure of such a color filter.

2. Description of the Prior Art

When a color image is reproduced by using a solid-state image pickup device, a color filter composed of filter elements having predetermined color components arranged in a mosaic or in stripes is mounted on the light-receiving surface of the solid-state image pickup device so that a plurality of light- receiving picture elements which are arranged on the light receiving surface correspond to respective color components. In the case of a mosaic color filter, although the structure is more complicated than that of a striped color filter, it is advantageous in that enhancement of the horizontal resolution is possible. For this reason, a solid-state image pickup device on which a mosaic color filter is mounted is generally adopted in video cameras and the like which are required to have a high resolution.

FIG. 1 is a plan view of the light-receiving portion of a CCD solid-state image pickup device of a frame transfer type on which a mosaic color filter is mounted, and FIG. 2 is a sectional view thereof, taken along the line X—X.

On the surface of a P-type silicon substrate 1, a plurality of isolating regions 2, which are composed of P-type regions having a high density or thick oxide films which are selectively oxidized, are formed in parallel with each other. N-type impurities are diffused on the surface portions of the substrate 1 between the isolating regions 2, thereby constituting channel regions 3 which serve as the transfer routes of information charges. A first layer of transfer electrodes 5 are arranged in parallel with each other in the direction orthogonal to the channel regions 3 on the silicon substrate 1, on which the isolating regions 2 and the channel regions 3 are formed, through an oxide film 4 which constitutes a gate insulation film. A second layer of transfer electrodes 6 are disposed on the first transfer electrodes 5 in such a manner as to cover the gaps between the transfer electrodes 5 and to be electrically isolated from the transfer electrodes 5 in the first layer. During the period of storing information charges which are produced by photoelectric conversion of the light projected from an object of observation, the potential of the transfer electrodes 5 in the first layer is set to be high and the potential of the transfer electrodes 6 in the second layer is set to be lower than that. As a result, potential wells are formed in the channel regions 3 under the transfer electrodes 5 in the first layer and potential barriers are formed in the channel regions 3 under the transfer electrodes 6 in the second layer, so that each channel region 3 which is continuous in the vertical direction in FIG. 1 is sectioned into a plurality of light-receiving picture elements. Each of the transfer electrodes 5, 6 is provided with a clock pulse of, for example, four phases so that the information charges stored in the potential wells are sequentially transferred to the output side along the channel regions 3.

A color filter 7 formed in such a manner as to cover the transfer electrodes 5, 6 is divided into a plurality of separate regions in correspondence with the light-receiving picture elements which are defined by the isolating regions 2 and the potential barriers formed on the transfer electrodes 6. Ye (yellow), Cy (cyan), W (white) and G (green) color components are allotted to the separate regions in accordance with a predetermined rule on the basis of the calculation of light-receiving signals (picture information) obtained from each vertical line so as to reproduce the R (red), G (green) and B (blue) color components. Actually, since a G filter is produced by laying a Cy filter and a and a Ye filter with one on top of the other, a first coloring layer 8 which constitutes a Ye filter is disposed at Ye color component regions and G color component regions, and a second coloring layer 9 which constitutes a Cy filter is disposed at Cy color component regions and G color component regions. A color filter 7 is composed of the first coloring layer 8 and the second coloring layer 9. Neither the color layer 8 nor the color layer 9 are disposed on the separate regions to which a W color component is allotted, and the light from the object of observation is directly projected to the light-receiving picture elements.

In the solid-state image pickup device of a frame transfer type explained above, since it is impossible to transfer the information charges stored in one light-receiving picture element independently of the information charges stored in another light-receiving picture element, the information charges for two rows of light-receiving picture elements in each channel region 3 are mixed and transferred along the channel region 3 with the information charges for two light-receiving picture elements as a unit. The combination of two light-receiving picture elements for mixing the information charges is inverted in every field so as to enable interlaced scanning, and picture information (light- receiving signals) which corresponds to the number of light-receiving picture elements in the vertical direction in FIG. 1 is obtained.

After the information charges are mixed, a signal of (Ye+W) color components and a signal of (Cy+G) color components are obtained from the light-receiving picture elements of an n-th row and the (n+1)th row, respectively, in an even-numbered field, for example, and a signal of an R color component is produced from the difference between these signals, as shown by the following formula (1):

$$(Ye + W) - (Cy + G) = (2R + 2G + B) - (2G + B) \qquad (1)$$
$$= 2R$$

wherein Ye=R+G, Cy =G+B.

In the same field (even-numbered field), a signal of (Cy+W) color components and a signal of (Ye+G) color components are obtained from the light-receiving picture elements of the subsequent (n+2)th row and the (n+3)th row, respectively, and a signal of a B color component is produced from the difference between these signals, as shown by the following formula (2):

$$(Cy + W) - (Ye + G) = (R + 2G + 2B) - (2G + R) \qquad (2)$$
$$= 2B$$

By synthesizing the signals of (Ye+W) color components and (Cy+W) color components or the signals of (Cy+W) color components and (Ye+G) color component, which are obtained from the respective light-receiving picture elements, a brightness signal (light-receiving picture element) in which the R, G and B color components are synthesized in the ratio of 1:2:1 is produced, as shown in the following formula (3):

$$Ye+Cy+G+W=2R+4G+2B \qquad (3)$$

According to an NTSC standard, the original brightness signal produced by synthesis has the R, G and B color components in the ratio of 30%, 59% and 11%, but a brightness signal having these color components in approximately this ratio has no problem in practical use.

In an odd-numbered field, a B color component signal, an R color component signal and a brightness signal are produced by a similar calculation. That is, an R color component signal is produced from a signal of (W+Ye) color components and a signal of (G+Cy) color components obtained from the light-receiving picture elements of the (n−1)th row and the nth row, respectively, and a B color component signal is produced from a signal of (W+Cy) color components and (G+Ye) color components obtained from the light-receiving picture elements of the (n+1)th row and the (n+2)th row, respectively.

In this manner, in each field of interlaced scanning, R, G and B color component signals and a brightness signal are obtained from the light-receiving picture elements for four rows.

A CCD solid-state image pickup device of a full frame type which is capable of reading the information charges of each light-receiving picture element independently from the information charges of another light-receiving picture element without mixing the information charges for two light-receiving picture elements is now being developed. In such a CCD solid-state image pickup device of a full frame type, if it is assumed that an R color component signal is obtained from the light-receiving picture element of an even-numbered row, for example, it is necessary to obtain a B color component signal form the light-receiving picture element of an odd-numbered row and a common brightness signal from the light-receiving picture element of each row. In the solid-state image pickup device such as that shown in FIG. 1 in which one light-receiving picture element corresponds to one color component, however, it is impossible to produce a B color component signal or an R color component signal from the picture information of the light-receiving picture element of one row. If the arrangement of each color component of the color filter 7 is changed, it is possible to produce a B color component signal or an R color component signal from the picture information of the light-receiving picture element of one row. On the other hand, a change of the arrangement of the color components makes it impossible to produce a common brightness signal from the light-receiving picture element of each row. For this reason, it is difficult to put a CCD solid-state image pickup device of a full frame type to practical use.

SUMMARY OF THE INVENTION

Accordingly, it is an object of the present invention to eliminate the above-described problems in the prior art and to provide the structure of a color filter for a solid-state color image pickup device of a full frame type which enables a predetermined color component signal and a brightness signal having color components in a predetermined ratio which are necessary for producing predetermined color picture information to be produced from a picture signal obtained from each row.

To achieve this end, in a first aspect of the present invention, there is provided a solid-state color image pickup device comprising: a substrate, a plurality of light-receiving picture elements arranged in a matrix on the surface of the substrate; and a color filter which is provided in such a manner as to cover the plurality of light-receiving picture elements and which is composed of filter elements having a one-to-one correspondence to the light-receiving picture elements.

The filter elements include a first filter element and a second filter element disposed in odd-numbered rows so as to pass light having a first color component and light having a second color component, respectively, and a third filter element and a fourth filter element disposed in even-numbered rows so as to pass light having a third color component and light having a fourth color component, respectively.

The filter elements pass the light having color components which satisfy the following conditions:

the sum of a light-receiving signal obtained from the light-receiving picture element which corresponds to the first filter element on the basis of the light having the first color component and a light-receiving signal obtained from the light-receiving picture element which corresponds to the second filter element on the basis of the light having the second color component is equal to the sum of a light-receiving signal obtained from the light-receiving picture element which corresponds to the third filter element on the basis of the light having the third color component and a light-receiving signal obtained from the light-receiving picture element which corresponds to the fourth filter element on the basis of the light having the fourth color component;

a light-receiving signal of a first fundamental color component is obtained from the difference between the light-receiving signal based on the light having the first color component and the light-receiving signal based on the light having the second color component; and a light-receiving signal of a second fundamental color component is obtained from the difference between the light-receiving signal based on the light having the third color component and the light-receiving signal based on the light having the fourth color component.

Each of the filter elements is composed of at least two color component regions having different color components, and each color component region has one color component selected from the group consisting of the three primary colors of light and the complementary colors thereof.

Each of the first and second fundamental color components includes at least one of the three primary colors.

Each of the sum of a light-receiving signal based on the light having the first color component and a light-receiving signal based on the light having the second color component and the sum of a light-receiving signal based on the light having the third color component and a light-receiving signal based on the light having the fourth color component is coincident with a brightness signal having the color components of the three primary colors in a predetermined ratio.

Since the sum of the light-receiving signal of the light having the first color component and the light-receiving signal of the light having the second color component is coincident with the sum of the light-receiving signal of the light having the third color component and the light-receiving signal of the light having the fourth color component, as described above, the sum of the light-receiving signals (picture signals) obtained in each row has the same color components. By adding the information obtained from adjacent light-receiving picture elements (the first filter element and the second filter element, and the third filter element and the fourth filter element) in each row, it is possible to obtain a light-receiving signal (brightness signal) having color components in a predetermined ratio in each row.

In addition, since a light-receiving signal having the first fundamental color component and a light-receiving signal having the second fundamental color component are obtained from the difference between the light-receiving signal based on the light having the first color component and the light-receiving signal based on the light having the second color component, and the difference between the light-receiving signal based on the light having the third color component and the light-receiving signal based on the light having the fourth color component, respectively, it is possible to obtain a predetermined color component signal which is necessary for each row.

In this manner, it is possible to obtain a predetermined color component signal and a brightness signal having color components in a predetermined ratio which are necessary for producing predetermined color picture information.

In a second aspect of the present invention, there is provided a solid-state color image pickup device comprising: a substrate; a plurality of light-receiving picture elements arranged in a matrix on the surface of the substrate; and a color filter provided in such a manner as to cover the plurality of light-receiving picture elements, wherein the color filter is divided into a plurality of units of color component regions, each unit is composed of three different color component regions arranged in the direction of a row in correspondence with two adjacent light-receiving picture elements in one row, and one of the three color component regions bridges over the two adjacent light-receiving picture elements.

The color filter is composed of filter elements which have one-to-one correspondence to the light-receiving picture elements and each of which has two color component regions. A first filter element and a second filter element for passing light having a first color component and light having a second color component, respectively, are disposed in odd-numbered rows, and a third filter element and a fourth filter element for passing light having a third color component and light having a fourth color component, respectively, are disposed in even-numbered rows.

The filter elements pass the light having color components which satisfy the following conditions:

the sum of a light-receiving signal obtained from the light-receiving picture element which corresponds to the first filter element on the basis of the light having the first color component and a light-receiving signal obtained from the light-receiving picture element which corresponds to the second filter element on the basis of the light having the second color component is equal to the sum of a light-receiving signal obtained from the light-receiving picture element which corresponds to the third filter element on the basis of the light having the third color component and a light-receiving signal obtained from the light-receiving picture element which corresponds to the fourth filter element on the basis of the light having the fourth color component;

a light-receiving signal of a first fundamental color component is obtained from the difference between the light-receiving signal based on the light having the first color component and the light-receiving signal based on the light having the second color component; and a light-receiving signal of a second fundamental color component is obtained from the difference between the light-receiving signal based on the light having the third color component and the light-receiving signal based on the light having the fourth color component.

According to this structure, it is possible to provide two different color component regions in each filter element of the color filter, which has a one-to-one correspondence with each light-receiving picture element, by reducing the width of each color component region in the direction of a row of the color filter to ⅔ without changing the length in the direction of a vertical line of the color filter. Since color picture information is produced on the basis of the picture signals obtained from the light-receiving picture elements for one row, it is easy to obtain a predetermined color component signal and a brightness signal having color components in a predetermined ratio which are necessary for producing color picture information.

In addition, the color component regions of the color filter are arranged in the same order in an odd-numbered row and an even-numbered row, and the position of each color component region in an odd-numbered row is shifted in the direction of a row of the color filter from the position of each component region in an even-numbered row by one color component region.

The color filter is composed of a first filter having a first color component and a second filter having a second color component in the same pattern as in the first color filter. In the first filter and the second filter, a gap which corresponds to one color component region is provided after every two color component regions, and the position of each gap in an odd-numbered row is shifted from the position of each gap in an even-numbered row by one color component region. The first filter and the second filter are laid with one on top of the other in such a manner that an edge of one filter is shifted in the direction of a row of the filter from that of an edge of the other filter by one color component region, thereby forming a third color component.

As described above, if the width of a color component region in the first filter and the second filter in the direction of a row of a light-receiving picture element is reduced to ⅔ of a light-receiving picture element without changing the length thereof in the direction of a vertical line, and the first filter and the second filter are laid with one on top of the other in the above-described manner, it is possible to provide a color filter which is capable of producing a necessary color component signal and a brightness signal having color components in a predetermined ratio for each row. Consequently, according to this structure, it is possible to easily produce a mosaic color filter with the same degree of precision as the production of a striped color filter.

The above and other objects, features and advantages of the present invention will become clear from the following description of the preferred embodiments thereof, taken in conjunction with the accompanying drawings.

DESCRIPTION OF THE PREFERRED EMBODIMENTS

Figure 3:
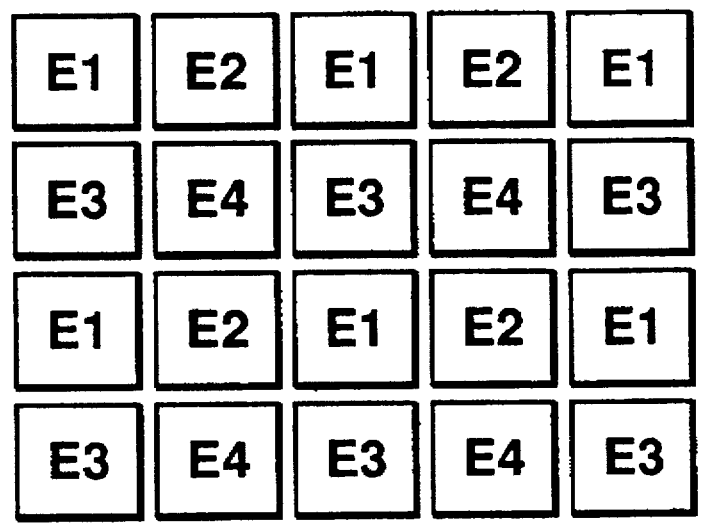
FIG. 3 is a plan view of the structure of a color filter of a solid-state color image pickup device according to the present invention.

Referring first to FIG. 3, which is a plan view of the structure of a color filter for a solid-state color image pickup device according to the present invention, filter elements are shown which are arranged in a matrix in such a manner as to correspond to a plurality of light-receiving picture elements.

The color filter is composed of first to fourth filter elements E1 to E4. The first and second filter elements E1, E2 are alternately arranged in an odd-numbered row, and the third and fourth filter elements E3, E4 are alternately arranged in an even-numbered row. Each of the first to fourth elements E1 to E4 is composed of a combination of two or three color component regions having color components selected from the group consisting of the three primary colors (red: R, green: G, and blue: B) and the complementary colors thereof (yellow: Ye, magenta: Mg, and cyan: Cy) in a predetermined ratio. The combination ratio is determined so as to satisfy the following formula (4):

$$\begin{cases} E1 + E2 = E3 + E4 \\ |E1 - E2| = C1 \\ |E3 - E4| = C2 \end{cases} \quad (4)$$

wherein C1 and C2 each represent the difference between the signals which represent one or two components of the three primary colors.

In other words, the combination ratio is determined so that the color component represented by the sum of the signals obtained from the light-receiving picture elements which correspond to the first and second filter elements E1, E2 arranged in an odd-numbered row is equal to the color components represented by the sum of the signals obtained from the light-receiving picture elements which correspond to the third and fourth filter elements E3, E4 arranged in an even-numbered row. In addition, the combination ratio is further determined so that a color component of the three primary colors is obtained from the difference between the signals obtained from the light-receiving picture elements which correspond to the first and second filter elements E1, E2, and another color component of the three primary colors is obtained from the difference between the signals obtained from the light-receiving picture elements which correspond to the third and fourth filter elements E3, E4.

If each group of the first and second filter elements E1 and E2, and the third and fourth filter elements E3 and E4 contains the R, G and B color components in a predetermined ratio, it is possible to represent a brightness signal by E1+E2, and E3+E4.

If a color filter composed of the first to fourth filter elements E1 to E4 is mounted on a solid-state image pickup device, it is possible to produce a brightness signal and a signal having a fundamental color component by the addition process or the subtraction process with respect to picture signals obtained from the light-receiving picture elements in one row. The process necessary for producing picture signals which are necessary for reproducing a color picture is therefore simplified and, hence, a signal processing circuit is simplified.

Since it is only necessary in such a color filter that the first to fourth filter elements E1 to E4 have one-to-one correspondence to the light-receiving picture elements, this color filter is applicable to any of the solid-state image sensors of a frame transfer type, an interline type and a frame interline type.

First Embodiment

Figure 4:
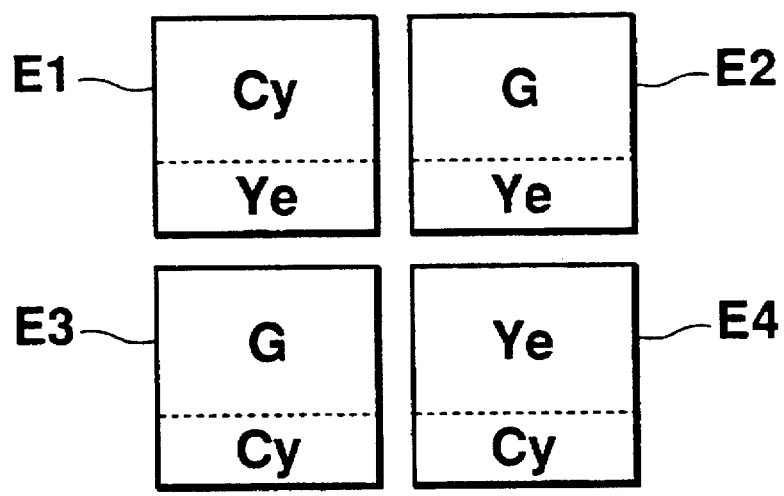
FIG. 4 is a plan view of the structure of a first embodiment of a color filter according to the present invention.

FIG. 4 is a plan view of an example of the arrangement of the color components in a first embodiment of a color filter in which the first to fourth filter elements E1 to E4 are composed of Ye, Cy and G color components.

In the first filter element E1, a Cy color component and a Ye color component are arranged in the ratio of 2:1, and in the second filter element E2, a G color component and a Ye color component are arranged in the ratio of 2:1. In the third filter element E3, a G color component and a Cy color component are arranged in the ratio of 2:1, and in the fourth filter element E4, a Ye color component and a Cy color component are arranged in the ratio of 2:1. Therefore, the first to fourth filter elements E1 to E4 are represented by the following formula (5):

$$\begin{cases} E1 = 2Cy + Ye \\ E2 = 2G + Ye \\ E3 = 2G + Cy \\ E4 = 2Ye + Cy \end{cases} \quad (5)$$

By synthesizing the signal obtained from the light-receiving picture element which corresponds to the first filter element E1 and the signal obtained from the light-receiving picture element which corresponds to the second filter element E2 in an odd-numbered row, the following formula (6) is obtained:

$$\begin{aligned} E1 + E2 &= (2Cy + Ye) + (2G + Ye) \\ &= 2R + 6G + 2B \end{aligned} \quad (6)$$

Similarly, by synthesizing the signal obtained from the light-receiving picture element which corresponds to the third filter element E3 and the signal obtained from the light-receiving picture element which corresponds to the fourth filter element E4 in an even-numbered row, the following formula (7) is obtained:

$$\begin{aligned} E3 + E4 &= (2G + Cy) + (2Ye + Cy) \\ &= 2R + 6G + 2B \end{aligned} \quad (7)$$

Each of the formulas (6) and (7) represents a brightness signal in which the R, G and B color components are synthesized in the ratio of 1:3:1. This brightness signal is not coincident with the original brightness signal, but since the color components are synthesized in the ratio approximate to the ratio in accordance with the NTSC standard, there is no problem in practical use.

It is possible to obtain a B color component signal from the difference between the signal obtained from the light-receiving picture element which corresponds to the first filter element E1 and the signal obtained from the light-receiving picture element which corresponds to the second filter element E2, as represented by the following formula (8):

$$|E1-E2| = (2Cy+Ye)-(2G+Ye) \quad (8)$$
$$= 2Cy-2G$$
$$= 2B$$

Similarly, it is possible to obtain an R color component signal from the difference between the signal obtained from the light-receiving picture element which corresponds to the third filter element E3 and the signal obtained from the light-receiving picture element which corresponds to the fourth filter element E4, as represented by the following formula (9):

$$|E3-E4| = (2Ye+Cy)-(2G+Cy) \quad (9)$$
$$= 2Ye-2G$$
$$= 2R$$

In this way, each of the first to fourth filter elements E1 to E4, is divided into color component regions in the ratio of 2:1, and the divided color component regions are allotted to Cy, Ye and G color components, as shown in FIG. 4. Alternatively, it is possible to form the first to fourth filter elements E1 to E4 so that each filter element itself directly has a spectral characteristic which satisfies the formula (5).

Second Embodiment

Figure 5:
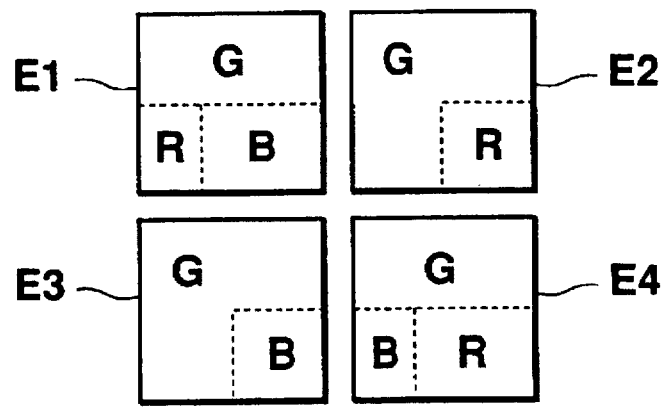
FIG. 5 is a plan view of the structure of a second embodiment of a color filter according to the present invention.

FIG. 5 is a plan view of an example of the arrangement of the color components in a second embodiment of a color filter in which the first to fourth filter elements E1 to E4 are composed of R, G and B color components.

In the first filter element E1, R, G and B color components are arranged in the ratio of 1:3:2, and in the second filter element E2, an R color component and a G color component are arranged in the ratio of 1:3. In the third filter element E3, a G color component and a B color component are arranged in the ratio of 3:1, and in the fourth filter element E4, R, G and B color components are arranged in the ratio of 2:3:1. Therefore, the first to fourth filter elements E1 to E4 are represented by the following formula (10):

$$\begin{cases} E1 = R+3G+2B \\ E2 = R+3G \\ E3 = 3G+B \\ E4 = 2R+3G+B \end{cases} \quad (10)$$

By synthesizing the signal obtained from the light-receiving picture element which corresponds to the first filter element E1 and the signal obtained from the light-receiving picture element which corresponds to the second filter element E2 in an odd-numbered row, the following formula (11) is obtained:

$$E1+E2 = (R+3G+2B)+(R+3G) \quad (11)$$
$$= 2R+6G+2B$$

Similarly, by synthesizing the signal obtained from the light-receiving picture element which corresponds to the third filter element E3 and the signal obtained from the light-receiving picture element which corresponds to the fourth filter element E4 in an even-numbered row, the following formula (12) is obtained:

$$E3+E4 = (3G+B)+(2R+3G+B) \quad (12)$$
$$= 2R+6G+2B$$

Each of the formulas (11) and (12) represents a brightness signal in which the R, G and B color components are synthesized in the ratio of 1:3:1 in the same way as the formula (7).

It is possible to obtain a B color component signal from the difference between the signal obtained from the light-receiving picture element which corresponds to the first filter element E1 and the signal obtained from the light-receiving picture element which corresponds to the second filter element E2, as represented by the following formula (13):

$$|E1-E2| = (R+3G+2B)-(R+3G) \quad (13)$$
$$= 2B$$

Similarly, it is possible to obtain an R color component signal from the difference between the signal obtained from the light-receiving picture element which corresponds to the third filter element E3 and the signal obtained from the light-receiving picture element which corresponds to the fourth filter element E4, as represented by the following formula (14):

$$|E3-E4| = (2R+3G+B)-(3G+B) \quad (14)$$
$$= 2R$$

In this way, each of the first to fourth filter elements E1 to E4 is divided into color component regions in the ratio of 1:2:3 or 1:3, and the divided color component regions are allotted to R, G and B color components, as shown in FIG. 5. Alternatively, it is possible to form the first to fourth filter elements E1 to E4 so that each filter element itself directly has a spectral characteristic which satisfies the formula (10).

Third Embodiment

Figure 6:
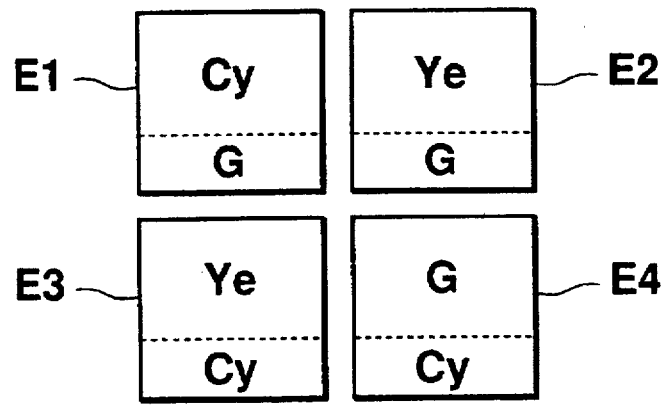
FIG. 6 is a plan view of the structure of a third embodiment of a color filter according to the present invention.

FIG. 6 is a plan view of an example of the arrangement of the color components in a third embodiment of a color filter in which the first to fourth filter elements E1 to E4 are composed of Ye, Cy and G color components.

In the first filter element E1, a Cy color component and a G color component are arranged in the ratio of 2:1, and in the second filter element E2, a Ye color component and a G color component are arranged in the ratio of 2:1. In the third filter element E3, a Ye color component and a Cy color component are arranged in the ratio of 2:1, and in the fourth filter element E4, a G color component and a Cy color component are arranged in the ratio of 2:1. Therefore, the first to fourth filter elements E1 to E4 are represented by the following formula (15):

$$\begin{cases} E1 = 2Cy+G \\ E2 = 2Ye+G \\ E3 = 2Ye+Cy \\ E4 = 2G+Cy \end{cases} \quad (15)$$

By synthesizing the signal obtained from the light-receiving picture element which corresponds to the first filter element E1 and the signal obtained from the light-receiving picture element which corresponds to the second filter element E2 in an odd-numbered row, the following formula (16) is obtained:

$$E1+E2 = (2Cy+G)+(2Ye+G) \quad (16)$$
$$= 2R+6G+2B$$

Similarly, by synthesizing the signal obtained from the light-receiving picture element which corresponds to the third filter element E3 and the signal obtained from the light-receiving picture element which corresponds to the fourth filter element E4 in an even-numbered row, the following formula (17) is obtained:

$$E3+E4 = (2Ye+Cy)+(2G+Cy) \quad (17)$$
$$= 2R+6G+2B$$

Each of the formulas (16) and (17) represents a brightness signal in which the R, G and B color components are synthesized in the ratio of 1:3:1 in the same way as the formula (7).

It is possible to obtain a signal representing the difference between a B color component signal and an R color component signal from the difference between the signal obtained from the light-receiving picture element which corresponds to the first filter element E1 and the signal obtained from the light-receiving picture element which corresponds to the second filter element E2, as represented by the following formula (18):

$$|E1 - E2| = (2Cy + G) - (2Ye + G) \qquad (18)$$
$$= 2Cy - 2Ye$$
$$= 2B - 2R$$

Similarly, it is possible to obtain an R color component signal from the difference between the signal obtained from the light-receiving picture element which corresponds to the third filter element E3 and the signal obtained from the light-receiving picture element which corresponds to the fourth filter element E4, as represented by the following formula (19):

$$|E3 - E4| = (2Ye + Cy) - (2G + Cy) \qquad (19)$$
$$= 2Ye - 2G$$
$$= 2R$$

It is possible to obtain a B color component signal by adding the R color component signal represented by the formula 19 to the signal representing the difference between a B color component signal and an R color component signal represented by the formula (18).

In this way, each of the first to fourth filter elements E1 to E4 is divided into color component regions in the ratio of 2:1, and the divided color component regions are allotted to Cy, Ye and G color components, as shown in FIG. 6. Alternatively, it is possible to form the first to fourth filter elements E1 to E4 so that each filter element itself directly has a spectral characteristic which satisfies the formula (15).

Fourth Embodiment

Figure 7:
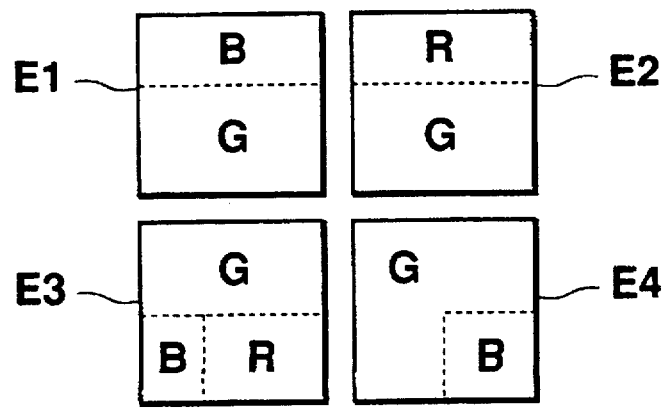
FIG. 7 is a plan view of the structure of a fourth embodiment of a color filter according to the present invention.

FIG. 7 is a plan view of an example of the arrangement of the color components in a fourth embodiment of a color filter in which the first to fourth filter elements E1 to E4 are composed of R, G and B color components.

In the first filter element E1, a G color component and a B color component are arranged in the ratio of 3:2, and in the second filter element E2, an R color component and a G color component are arranged in the ratio of 2:3. In the third filter element E3, R, G and B color components are arranged in the ratio of 2:3:1, and in the fourth filter element E4, a G color component and a B color component are arranged in the ratio of 3:1. Therefore, the first to fourth filter elements E1 to E4 are represented by the following formula (20):

$$\begin{cases} E1 = 3G + 2B \\ E2 = 2R + 3G \\ E3 = 2R + 3G + B \\ E4 = 3G + B \end{cases} \qquad (20)$$

By synthesizing the signal obtained from the light-receiving picture element which corresponds to the first filter element E1 and the signal obtained from the light-receiving picture element which corresponds to the second filter element E2 in an odd-numbered row, the following formula (21) is obtained:

$$E1 + E2 = (3G + 2B) + (2R + 3G) \qquad (21)$$
$$= 2R + 6G + 2B$$

Similarly, by synthesizing the signal obtained from the light-receiving picture element which corresponds to the third filter element E3 and the signal obtained from the light-receiving picture element which corresponds to the fourth filter element E4 in an even-numbered row, the following formula (22) is obtained:

$$E3 + E4 = (2R + 3G + B) + (3G + B) \qquad (22)$$
$$= 2R + 6G + 2B$$

Each of the formulas (21) and (22) represents a brightness signal in which the R, G and B color components are synthesized in the ratio of 1: 3 : 1 in the same way as the formula (7).

It is possible to obtain a signal representing the difference between a B color component signal and an R color component signal from the difference between the signal obtained from the light-receiving picture element which corresponds to the first filter element E1 and the signal obtained from the light-receiving picture element which corresponds to the second filter element E2, as represented by the following formula (23):

$$|E1 - E2| = (3G + 2B) - (2R + 3G) \qquad (23)$$
$$= 2B - 2R$$

Similarly, it is possible to obtain an R color component signal from the difference between the signal obtained from the light-receiving picture element which corresponds to the third filter element E3 and the signal obtained from the light-receiving picture element which corresponds to the fourth filter element E4, as represented by the following formula (24):

$$|E3 - E4| = (2R + 3G + B) - (3G + B) \qquad (24)$$
$$= 2R$$

It is possible to obtain a B color component signal by adding the R color component signal represented by the formula 24 to the signal representing the difference between a B color component signal and an R color component signal represented by the formula (23).

In this way, each of the first to fourth filter elements E1 to E4 is divided into color component regions in the ratio of 2:3, 1:3, or 1:2:3, and the divided color component regions are allotted to the R, G and B color components, as shown in FIG. 7. Alternatively, it is possible to form the first to fourth filter elements E1 to E4 so that each filter element itself directly has a spectral characteristic which satisfies the formula (20).

Fifth embodiment

Figure 8:
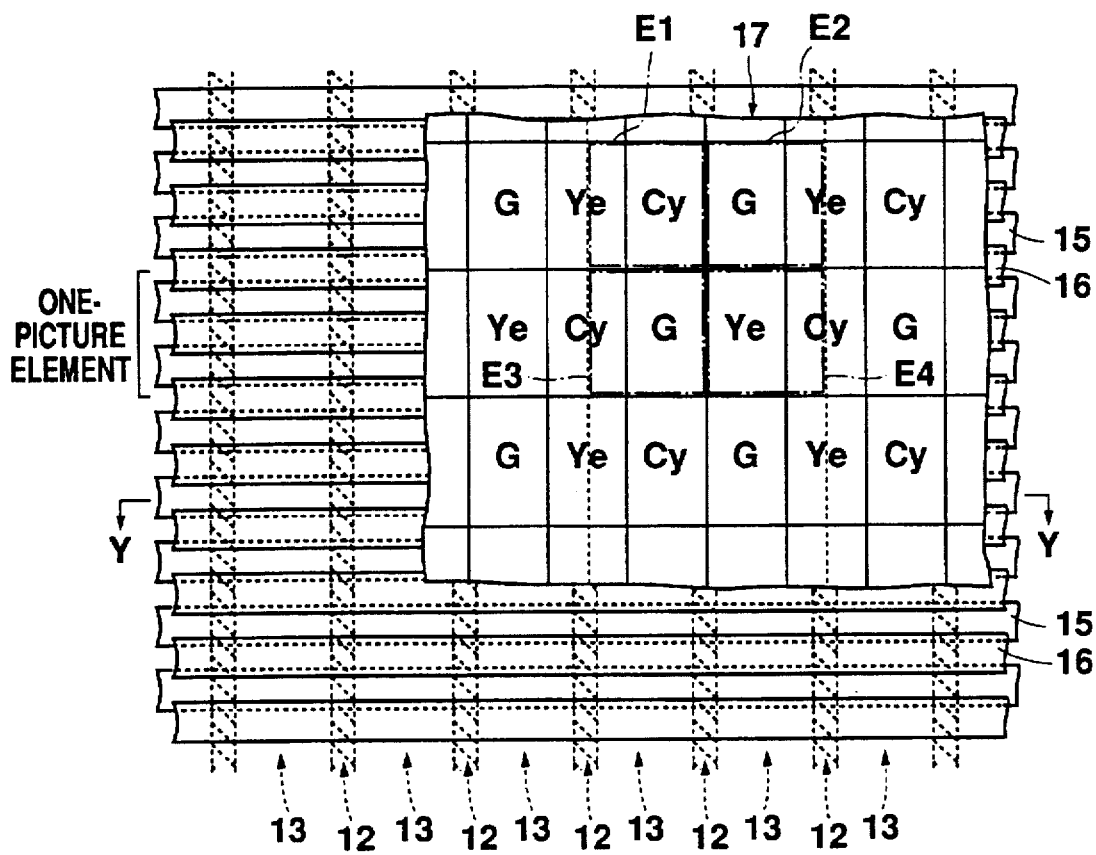
FIG. 8 is a plan view of a light-receiving portion of a solid-state color image pickup device on which a fifth embodiment of a color filter according to the present invention is mounted.
Figure 9:
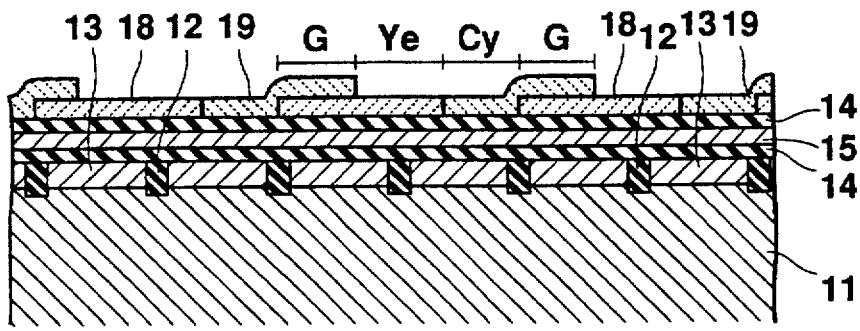
FIG. 9 is a sectional view of the fifth embodiment shown in FIG. 8, taken along the line Y—Y.

FIG. 8 is a plan view of the light-receiving portion of a CCD solid-state image pickup device of a full frame type on which a fifth embodiment of a color filter of the present invention is mounted, and FIG. 9 is a sectional view thereof, taken along the line Y—Y. The color filter includes the first to fourth filter elements E1 to E4 which are composed of Ye, Cy and G color components.

Figure 1:
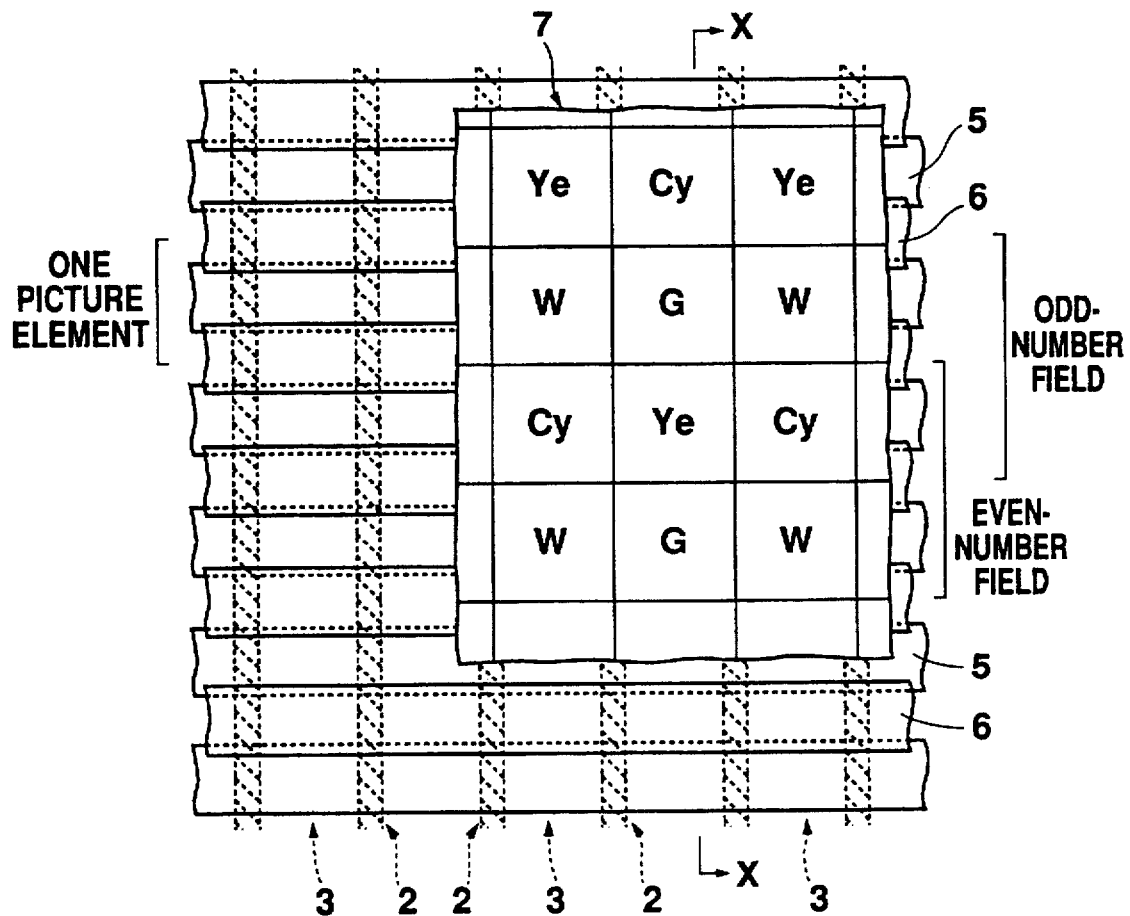
FIG. 1 is a plan view of a light-receiving portion of a conventional solid-state image pickup device.
Figure 2:
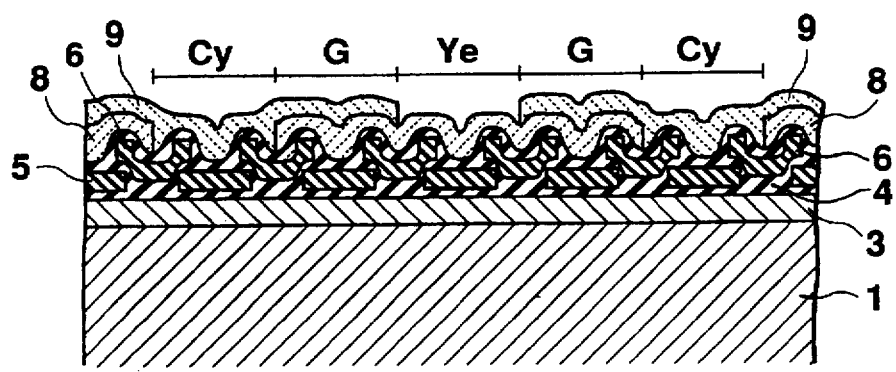
FIG. 2 is a sectional view of the solid-state image pickup device shown in FIG. 1, taken along the line X—X.

On the surface of a P-type silicon substrate 11, a plurality of isolating regions 12 which are composed of P-type regions having a high density are formed in parallel with each other. N-type impurities are diffused on the surface portions of the substrate 1 between the isolating regions 12, thereby constituting channel regions 13. The isolating regions 12 and the channel regions 13 are the same as those in the solid-state image pickup device shown in FIG. 1. A first layer of transfer electrodes 15 and a second layer of transfer electrodes 16 are arranged in parallel with each other in the direction orthogonal to the channel regions 13 on the silicon substrate 11, on which the isolating regions 12 and the channel regions 13 are formed, through an oxide film 14.

During the period of storing information charges which are produced by photoelectric conversion, the potential of the even-numbered transfer electrodes 16 in the second layer, for example, is set to be low so as to form potential barriers, and the potential of the transfer electrodes 15 in the first layer and the odd-numbered transfer electrodes 16 in the second layer is set to be high so as to form potential wells. Consequently, each channel region 13 which is continuous in the vertical direction in FIG. 8 is electrically isolated by the even-numbered transfer electrodes 16 in the second layer, and a plurality of light-receiving picture elements are formed. Each of the transfer electrodes 15, 16 is provided with a clock pulse of, for example, four phases so that the information charges stored in the potential wells are sequentially transferred to the output side along the channel regions 13. A pair of transfer electrodes 15 and a pair of transfer electrodes 16 (four transfer electrodes in total) are allocated to one picture element, and information charges stored in each light-receiving picture element are transferred independently of the information charges stored in another light-receiving picture element.

A color filter 17 formed in such a manner as to cover the transfer electrodes 15, 16 is vertically divided into a plurality of regions in correspondence with each row of the light-receiving picture elements. The color filter 17 is horizontally divided into a plurality of units of color component regions, and each unit is composed of three different color component regions arranged in correspondence with every two channel regions 13. The color component region which bridges over the two adjacent light-receiving picture elements with the isolating region 12 therebetween corresponds to ⅓ of two light-receiving picture elements and each of the color component regions on both sides of the color component region which bridges over the two adjacent light-receiving picture elements corresponds to ⅔ of each light-receiving picture element. Ye, Cy and G color components are allocated to the color component regions in a predetermined order. The order of color components allocated to each color component region is the same in each row, but the second color component region in an odd-numbered row comes first in an even-numbered row. In this manner, the first filter element E1 in which a Cy color component and a Ye color component are arranged in the ratio of 2:1, and the second filter element E2 in which a G color component and a Ye color component are arranged in the ratio of 2:1 are formed on an odd-numbered row. In the same way, the third filter element E3 in which a G color component and a Cy color component are arranged in the ratio of 2:1, and the fourth filter element E4 in which a Ye color component and a Cy color component are arranged in the ratio of 2:1 are formed on an even-numbered row.

It is possible to produce a filter of a G color component by laying a filter of a Cy color component on top of a filter of a Ye color component. For this reason, a first coloring layer 18 which constitutes a Ye filter is disposed at Ye component regions and G component regions, and a second coloring layer 19 which constitutes a Cy filter is disposed at Cy component regions and G component regions. A color filter 17 is composed of the first coloring layer 18 and the second coloring layer 19. In this way, the color component region at which only the first coloring layer 18 is disposed corresponds to a Ye color component, the color component region at which only the second coloring layer 19 is disposed corresponds to a Cy color component, and the color component region at which both the first coloring layer 18 and the second coloring layer 19 are disposed, with one on top of the other, corresponds to a G color component.

In the solid-state image pickup device on which the color filter 17 having the above-described structure is mounted, the first to fourth filter elements E1 to E4 are represented by the following formula (25):

$$E1 = 2Cy + Ye$$
$$E2 = 2G + Ye$$
$$E3 = 2G + Cy$$
$$E4 = 2Ye + Cy \quad (25).$$

By synthesizing the signal obtained from the light-receiving picture element which corresponds to the first filter element E1 and the signal obtained from the light-receiving picture element which corresponds to the second filter element E2 in an odd-numbered row, the following formula (26) is obtained:

$$\begin{aligned} E1 + E2 &= (2Cy + Ye) + (2G + Ye) \\ &= 2Ye + 2G + 2Cy \\ &= 2R + 6G + 2B \end{aligned} \quad (26)$$

Similarly, by synthesizing the signal obtained from the light-receiving picture element which corresponds to the third filter element E3 and the signal obtained from the light-receiving picture element which corresponds to the fourth filter element E4 in an even-numbered row, the following formula (27) is obtained:

$$\begin{aligned} E3 + E4 &= (2G + Cy) + (2Ye + Cy) \\ &= 2Ye + 2G + 2Cy \\ &= 2R + 6G + 2B \end{aligned} \quad (27)$$

Each of the formulas (26) and (27) represents a brightness signal in which the R, G and B color components are synthesized in the ratio of 1:3:1 in the same way as the formula (7). This brightness signal is not coincident with the original brightness signal, but the color components are synthesized in the ratio approximate to the ratio in accordance with the NTSC standard, and there is no problem in practical use.

The difference between the signal obtained from the light-receiving picture element which corresponds to the first filter element E1 and the signal obtained from the light-receiving picture element which corresponds to the second filter element E2 is represented by the following formula (28):

$$\begin{aligned} |E1 - E2| &= (2Cy + Ye) - (2G + Ye) \\ &= 2Cy - 2G \\ &= 2B \end{aligned} \quad (28)$$

Similarly, the difference between the signal obtained from the light-receiving picture element which corresponds to the third filter element E3 and the signal obtained from the light-receiving picture element which corresponds to the fourth filter element E4 is represented by the following formula (29):

$$|(2G + Cy) - (2Ye + Cy)|2G - 2Ye| = 2R \quad (29)$$

In this way, it is possible to obtain an R color component signal and a B color component signal from the light-receiving picture elements for two rows, as represented by the formulas 28 and 29, and it is possible to obtain a brightness signal from each row. It is easy to obtain a G color component signal by subtracting the R color component signal and the B color component signal from the brightness signal.

Figure 10:
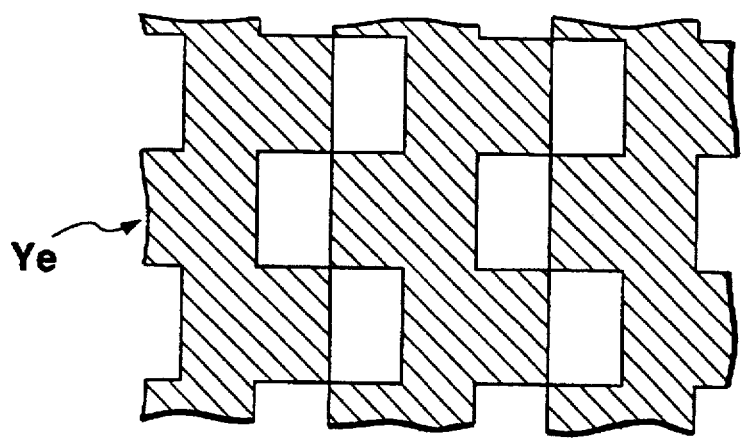
FIG. 10 shows the structure of the first filter of the color filter 17 in FIG. 8.
Figure 11:
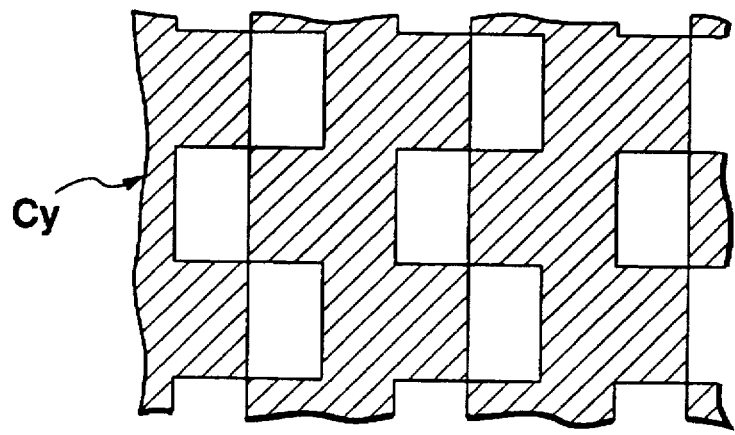
FIG. 11 shows the structure of the second filter of the color filter 17 in FIG. 8.
Figure 12:
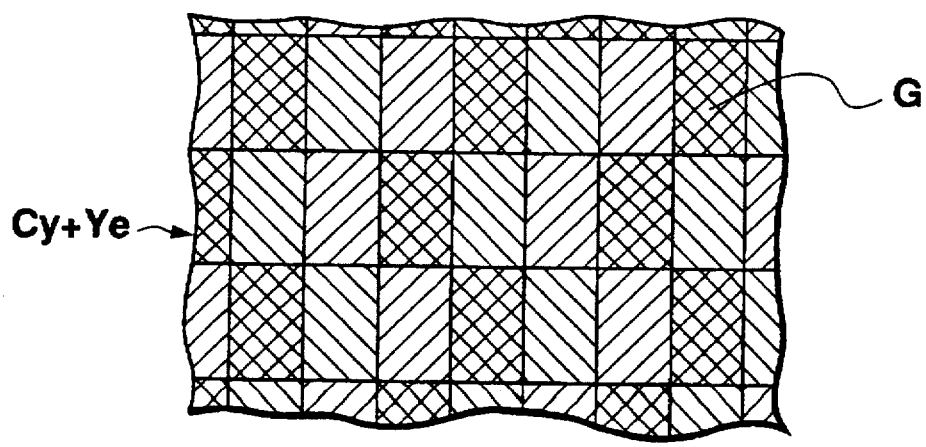
FIG. 12 shows the structure of the first filter shown in FIG. 10 and the second filter shown in FIG. 11 which are laid with one on top of the other.

FIGS. 10, 11 and 12 are plan views explaining a method of producing the color filter 17 shown in FIG. 8.

Referring first to FIG. 10 which shows a first filter corresponding to a Ye color component, the first filter is divided into color component regions in a matrix. In each row, one opening which corresponds to one color component region is provided after every two color component regions, and the position of each opening in an odd-numbered row is shifted from the position of each opening in an even-numbered row by one color component region. The first filter corresponds to the first coloring layer 18 shown in FIG. 9. A second filter which corresponds to a Cy component has the same shape as the first filter, as shown in FIG. 11, and corresponds to the second coloring layer 19 shown in FIG. 9.

The first filter shown in FIG. 10 and the second filter shown in FIG. 11, which both have the same shape, are laid one on top of the other in such a manner that the side end of one filter is shifted in the direction of a row of the filter from the side end of the other filter by one color component region. As a result, G component regions are produced, as indicated by the cross-hatched portions in FIG. 12. Since an opening of one filter is covered with an opening of the other filter, the opening of each filter constitutes a Cy color component or a Ye color component.

In the first and second filters, since the same color components are consecutive in the direction of a vertical line, it is possible to form the same color components consecutively in the direction of a vertical line when the coloring layers 18 and 19 are formed on the light-receiving portion of a solid-state image pickup device in the same way as in a striped color filter.

This method of producing a mosaic filter is effective when it is applied to a solid-state image pickup device of a full frame type such as that shown in FIG. 8, but this method is also applicable to a filter in which one color component corresponds to one light-receiving picture element.

In this embodiment, a G color component is obtained by laying a Ye filter and a Cy filter one on top of the other. If a third color component is obtained by laying two kinds of filters, which correspond to a first color component and a second color component, one on top of the other, another filter may be combined with these two filters.

For each of the coloring layers 18, 19 which constitute the color filter 17, a high polymer material such as gelatin and casein is generally used. It is known, however, that a coloring layer which is composed of such a high polymer material is difficult to finely divide, as in the production of the transfer electrodes 15, 16 which are composed of polycrystalline silicon or the like.

In the structure of this embodiment, picture information which is necessary for obtaining a color picture is obtained in each row of a light-receiving picture element by shortening the width of each separate color component region of the color filter in the direction of a row of the color filter to ⅔ of that in a conventional color filter without changing the length in the direction of a vertical line. In this embodiment, it is therefore possible to greatly enhance the resolution of a solid-state color image pickup device without using a special material for a color filter but by simply shortening the width of each separate color component region of the color filter in the direction of a row of the color filter to about ⅔ of that in a conventional color filter.

According to the method of producing a mosaic filter in this embodiment, it is possible to produce the mosaic filter in a similar process to the process of a striped filter in which the same color components are consecutive in the direction of a vertical line. It is therefore possible to simplify the process for producing a color filter, thereby improving the productivity.

As explained above, according to the present invention, since it is possible to obtain a brightness signal and a predetermined fundamental color component signal from picture signals obtained from the light-receiving picture elements for one row, signal processing with respect to the picture signals output from a solid-state image pickup device is simplified. It is therefore possible to simplify the structure of a signal processing circuit for executing predetermined processing with respect to picture signals, and it is possible to reduce the cost of a solid-state image pickup device even if it reproduces a color picture.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A solid-state color image pickup device comprising:

a substrate;

a plurality of light-receiving picture elements arranged in a matrix on a surface of said substrate; and a color filter disposed to cover said plurality of light-receiving picture elements, said color filter including filter elements which have one-to-one correspondence to said light-receiving picture elements, wherein said filter elements include a first filter element and a second filter element disposed in odd-numbered rows so as to pass light having a first color component and light having a second color component, respectively, and a third filter element and a fourth filter element disposed in even-numbered rows so as to pass light having a third color component and light having a fourth color component, respectively, all of said filter elements passing light having color components which satisfies the following conditions:

a sum of a light-receiving signal obtained from a light-receiving picture element which corresponds to said first filter element on the basis of said light having said first color component and a light-receiving signal obtained from a light-receiving picture element which corresponds to said second filter element on the basis of said light having said second color component is equal to a sum of a light-receiving signal obtained from a light-receiving picture element which corresponds to said third filter element on the basis of said light having said third color component and a light-receiving signal obtained from a light-receiving picture element which corresponds to said fourth filter element on the basis of said light having said fourth color component;

a light-receiving signal of a first fundamental color component is obtained from a difference between said light-receiving signal based on said light having said first color component and said light-receiving signal based on said light having said second color component; and a light-receiving signal of a second fundamental color component is obtained from a difference between said light-receiving signal based on said light having said third color component and said light-receiving signal based on said light having said fourth color component.

2. The solid-state color image pickup device of claim 1, wherein each of said filter elements includes at least two color component regions having different color components, and each of said color component regions has one color component selected from the group consisting of primary colors of light and complementary colors thereof.

3. The solid-state color image pickup device of claim 1, wherein each of said first fundamental color component and said second fundamental color component includes at least one of three primary colors.

4. The solid-state color image pickup device of claim 1, wherein each of said sum of said light-receiving signal based on said light having said first color component and said light-receiving signal based on said light having said second color component and said sum of said light-receiving signal based on said light having said third color component and said light-receiving signal based on said light having said fourth color component is coincident with a brightness signal having all color components of three primary colors in a predetermined ratio.

5. A solid-state color image pickup device comprising:
 a substrate;
 a plurality of light-receiving picture elements arranged in a matrix on a surface of said substrate; and
 a color filter disposed to cover said plurality of light-receiving picture elements, wherein said color filter is divided into a plurality of units of color component regions arranged in a plurality of rows, each unit including three different color component regions arranged in a row in each of said plurality of rows in correspondence with two adjacent light-receiving picture elements, wherein a middle one of said three different color component regions is disposed over portions of both of said two adjacent light-receiving picture elements, and a position of each color component region in an odd-numbered row is shifted in a direction of said row of the color filter from a position of each color component region in an even-numbered row by one color component region.

6. A solid-state color image pickup device comprising:
 a substrate;
 a plurality of light-receiving picture elements arranged in a matrix on a surface of said substrate; and
 a color filter disposed to cover said plurality of light-receiving picture elements, wherein said color filter is divided into a plurality of units of color component regions, each unit including three different color component regions arranged in a row in correspondence with two adjacent light-receiving picture elements, wherein a middle one of said three different color component regions is disposed over portions of both of said two adjacent light-receiving picture elements, wherein said color filter includes filter elements which have one-to-one correspondence to said light-receiving picture elements and each of which has two color component regions;
 a first filter element and a second filter element for passing light having a first color component and light having a second color component, respectively, are disposed in odd-numbered rows;
 a third filter element and a fourth filter element for passing light having a third color component and light having a fourth color component, respectively, are disposed in even-numbered rows; and said filter elements pass light having color components which satisfies the following conditions:
 a sum of a light-receiving signal obtained from a light-receiving picture element which corresponds to said first filter element on the basis of said light having said first color component and a light-receiving signal obtained from a light-receiving picture element which corresponds to said second filter element on the basis of said light having said second color component is equal to a sum of a light-receiving signal obtained from a light-receiving picture element which corresponds to said third filter element on the basis of said light having said third color component and a light-receiving signal obtained from a light-receiving picture element which corresponds to said fourth filter element on the basis of said light having said fourth color component;
 a light-receiving signal of a first fundamental color component is obtained from a difference between said light-receiving signal based on said light having said first color component and said light-receiving signal based on said light having said second color component; and
 a light-receiving signal of a second fundamental color component is obtained from a difference between said light-receiving signal based on said light having said third color component and said light-receiving signal based on said light having said fourth color component.

7. A solid-state color image pickup device comprising:
 a substrate;
 a plurality of light-receiving picture elements arranged in a matrix on a surface of said substrate; and
 a color filter disposed to cover said plurality of light-receiving picture elements, wherein said color filter is divided into a plurality of units of color component regions, each unit including three different color component regions arranged in a row in correspondence with two adjacent light-receiving picture elements, wherein a middle one of said three different color component regions is disposed over portions of both of said two adjacent light-receiving picture elements, wherein said color component regions of said color filter are arranged in the same order in an odd-numbered row and an even-numbered row, and a position of each color component region in said odd-numbered row is shifted in a direction of said row of the color filter from a position of each color component region in said even-numbered row by one color component region.

8. A solid-state color image pickup device comprising:
 a substrate;
 a plurality of light-receiving picture elements arranged in a matrix on a surface of said substrate; and
 a color filter disposed to cover said plurality of light-receiving picture elements, wherein said color filter is divided into a plurality of units of color component regions, each unit including three different color component regions arranged in a row in correspondence with two adjacent light-receiving picture elements, wherein a middle one of said three different color component regions is disposed over portions of both of said two adjacent light-receiving picture elements, wherein said color filter includes a first filter layer having a first color component and a second filter layer having a second color component in the same pattern as in said first color filter layer;
 a gap which corresponds to one color component region is provided after every two color component regions, and a position of each gap in an odd-numbered row is shifted from a position of each gap in an even-numbered row by one color component region in each of said first filter layer and said second filter layer; and
 said first filter layer and said second filter layer are laid one on top of the other in such manner that an edge of one filter is shifted in a direction of said row of said color filter from that of an edge of the other filter by one color component region, thereby forming a third color component.

9. The solid-state color image pickup device of claim 1, wherein said light-receiving signal of said first fundamental color component is obtained from an absolute value of the difference between said light-receiving signal based on said light having said first color component and said light-receiving signal based on said light having said second color component, and said light-receiving signal of said second fundamental color component is obtained from an absolute value of the difference between said light-receiving signal based on said light having said third color component and said light-receiving signal based on said light having said fourth color component.

10. The solid-state color image pickup device of claim 5, wherein said color filter includes filter elements which have one-to-one correspondence to said light-receiving picture elements and each of which has two color component regions;

a first filter element and a second filter element for passing light having a first color component and light having a second color component, respectively, are disposed in odd-numbered rows;

a third filter element and a fourth filter element for passing light having a third color component and light having a fourth color component, respectively, are disposed in even-numbered rows; and said filter elements pass light having color components which satisfies the following conditions:

a sum of a light-receiving signal obtained from a light-receiving picture element which corresponds to said first filter element on the basis of said light having said first color component and a light-receiving signal obtained from a light-receiving picture element which corresponds to said second filter element on the basis of said light having said second color component is equal to a sum of a light-receiving signal obtained from a light-receiving picture element which corresponds to said third filter element on the basis of said light having said third color component and a light-receiving signal obtained from a light-receiving picture element which corresponds to said fourth filter element on the basis of said light having said fourth color component;

a light-receiving signal of a first fundamental color component is obtained from a difference between said light-receiving signal based on said light having said first color component and said light-receiving signal based on said light having said second color component; and a light-receiving signal of a second fundamental color component is obtained from a difference between said light-receiving signal based on said light having said third color component and said light-receiving signal based on said light having said fourth color component.

11. The solid-state color image pickup device of claim 5, wherein said color component regions of said color filter are arranged in the same order in said odd-numbered row and said even-numbered row.

12. The solid-state color image pickup device of claim 5, wherein said color filter includes a first filter layer having a first color component and a second filter layer having a second color component in the same pattern as in said first color filter layer;

a gap which corresponds to one color component region is provided after every two color component regions, and a position of each gap in said odd-numbered row is shifted from a position of each gap in said even-numbered row by one color component region in each of said first filter layer and said second filter layer; and said first filter layer and said second filter layer are laid one on top of the other in such manner that an edge of one filter is shifted in a direction of said row of said color filter from that of an edge of the other filter by one color component region, thereby forming a third color component.

13. The solid-state color image pickup device of claim 5, wherein said three different color component regions are formed by two filter layers, each filter layer having a different color component, and an overlap of said two filter layers.

14. The solid-state color image pickup device of claim 6, wherein said three different color component regions are formed by two filter layers, each filter layer having a different color component, and an overlap of said two filter layers.

15. The solid-state color image pickup device of claim 6, wherein said light-receiving signal of said first fundamental color component is obtained from an absolute value of the difference between said light-receiving signal based on said light having said first color component and said light-receiving signal based on said light having said second color component, and said light-receiving signal of said second fundamental color component is obtained from an absolute value of the difference between said light-receiving signal based on said light having said third color component and said light-receiving signal based on said light having said fourth color component.

16. The solid-state color image pickup device of claim 6, wherein each of said first fundamental color component and said second fundamental color component includes at least one of three primary colors.

17. The solid-state color image pickup device of claim 6, wherein each of said sum of said light-receiving signal based on said light having said first color component and said light-receiving signal based on said light having said second color component and said sum of said light-receiving signal based on said light having said third color component and said light-receiving signal based on said light having said fourth color component is coincident with a brightness signal having all color components of three primary colors in a predetermined ratio.

18. The solid-state color image pickup device of claim 7, wherein said three different color component regions are formed by two filter layers, each filter layer having a different color component, and an overlap of said two filter layers.

19. The solid-state color image pickup device of claim 10, wherein said light-receiving signal of said first fundamental color component is obtained from an absolute value of the difference between said light-receiving signal based on said light having said first color component and said light-receiving signal based on said light having said second color component, and said light-receiving signal of said second fundamental color component is obtained from an absolute value of the difference between said light-receiving signal based on said light having said third color component and said light-receiving signal based on said light having said fourth color component.

20. The solid-state color image pickup device of claim 10, wherein each of said first fundamental color component and said second fundamental color component includes at least one of three primary colors.

* * * * *